United States Patent [19]
Johnson

[11] Patent Number: 5,059,916
[45] Date of Patent: Oct. 22, 1991

[54] GAUGE DRIVER FOR USE WITH A REMOTE SENSOR AND HAVING REDUCED OFFSET POTENTIAL RESPONSE

[75] Inventor: Nick M. Johnson, Los Altos, Calif.

[73] Assignee: National Semiconductor Corporation, Santa Clara, Calif.

[21] Appl. No.: 462,174

[22] Filed: Jan. 8, 1990

[51] Int. Cl.$^5$ ............................................. G01R 27/02
[52] U.S. Cl. ..................................... 324/713; 324/143
[58] Field of Search ................ 324/691, 693, 713–715, 324/143, 146, 151 R, 154 R, 720, 128, 140 R, 141

[56] References Cited
U.S. PATENT DOCUMENTS
3,657,640  4/1972  Jelinek et al. .................. 324/693 X Primary Examiner—Jack B. Harvey
Attorney, Agent, or Firm—Gail W. Woodward; Michael A. Glenn; James W. Rose

[57] ABSTRACT

A gauge circuit for use with a wide angle air core meter display having high linearity and adapted for use with a remote sensing resistor. A constant sense current is provided and its value is moudlated at a frequency that is high with respect to the frequencies associated with offset voltages that occur with a sense resistor that is grounded remotely from the gauge ground. A low duty cycle pulse modulation shape is disclosed for the purpose of minimizing electromagnetic interference radiation.

6 Claims, 2 Drawing Sheets

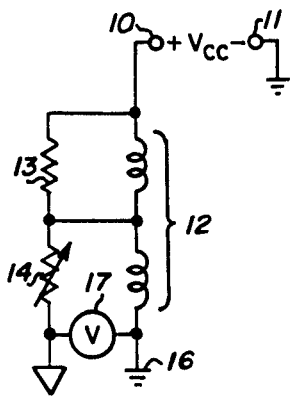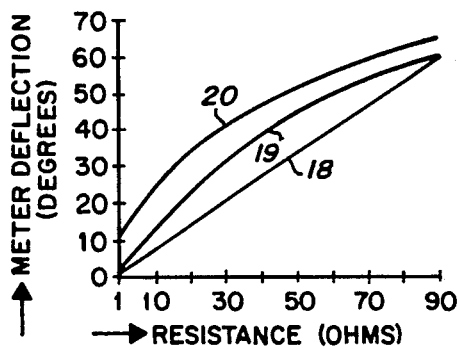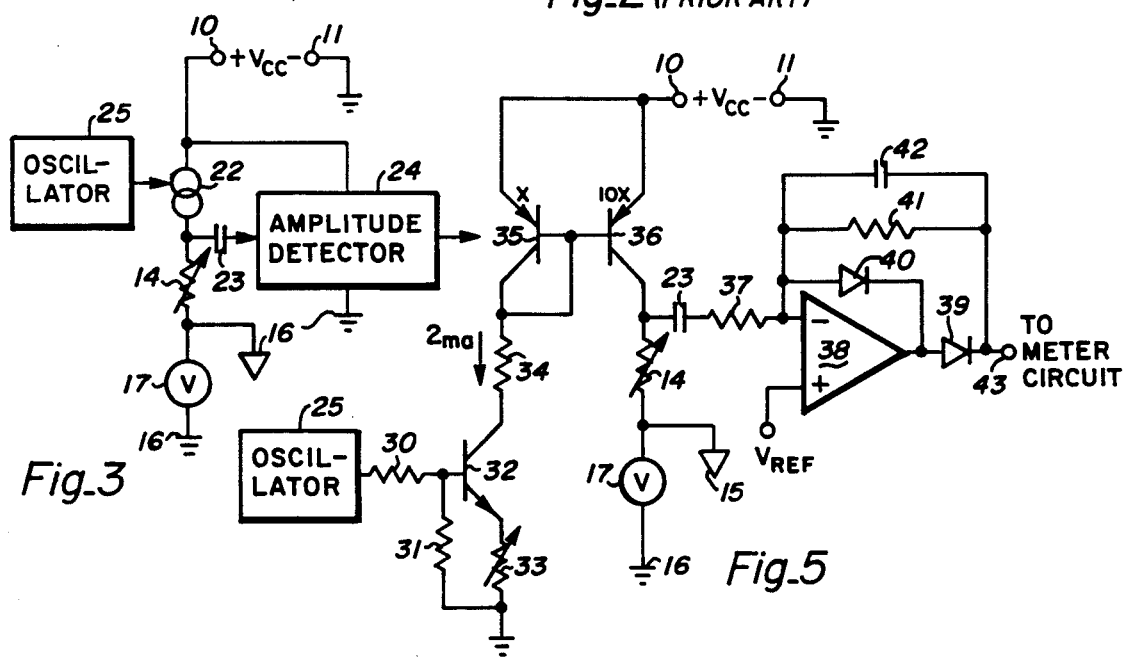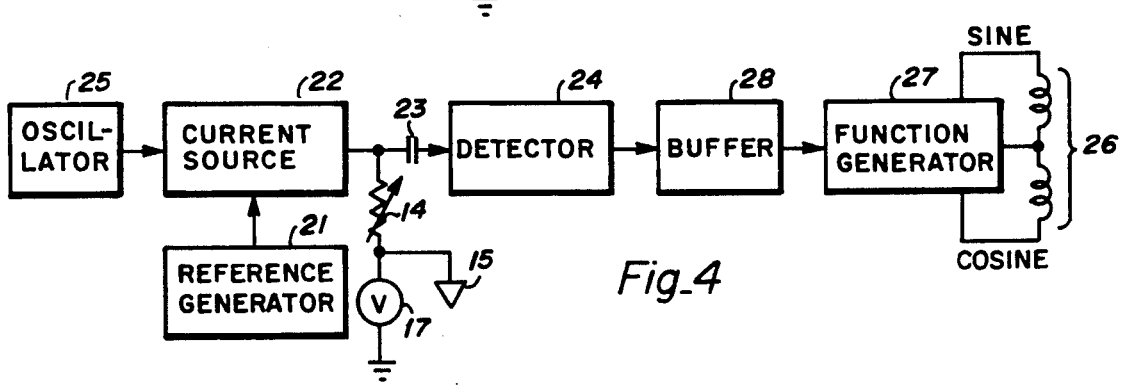

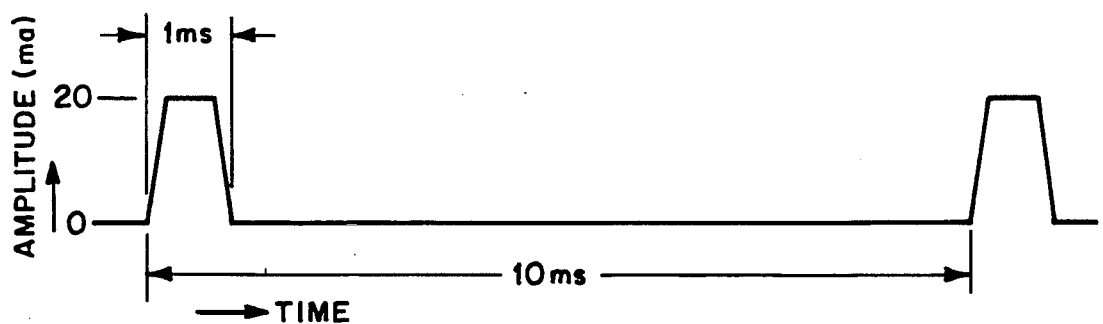
Fig_6
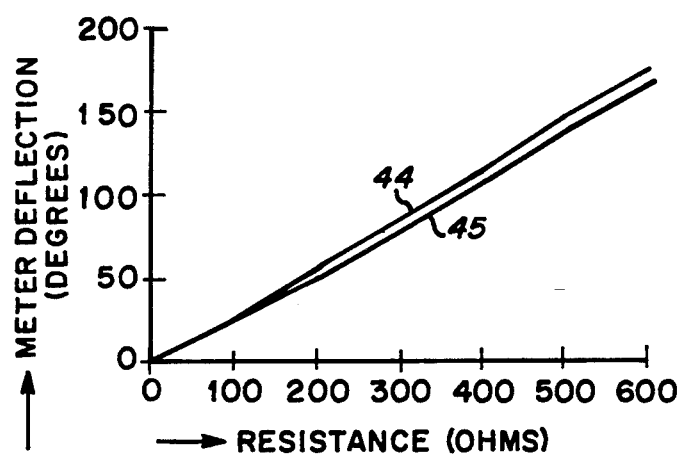
Fig_7

GAUGE DRIVER FOR USE WITH A REMOTE SENSOR AND HAVING REDUCED OFFSET POTENTIAL RESPONSE

BACKGROUND OF THE INVENTION

In automotive gauge systems, sensor resistors are located at the measurement point and one end is locally grounded. The other end is connected by a wire to the remote readout device which is also grounded at its own location. For example, to sense engine temperature the sensor resistor is located in thermal contact with the engine block and one resistor terminal is thereby grounded to the engine book. The other resistor terminal is connected via a wire to the gauge. The gauge is powered by the vehicle battery and grounded to the frame of the vehicle. Since the sensor ground is remote from the gauge ground their actual potentials can be different. It has been found that various ground points throughout the vehicle can develop offset potentials at several volts. Since the offset is in series with the sensor resistor a simple d-c gauge circuit will include an offset error.

FIG. 1 is a schematic diagram of a typical prior art fuel gauge circuit. It is powered From a $V_{CC}$ supply, provided by the vehicle battery, connected + to terminal 10 and − to ground terminal 11. The gauge meter itself is 60° to 70° deflection air core coil driven structure. Coil 12 comprises a pair of meter coils which typically have a 260 ohm resistance each. Resistor 13 shunts one element of coil 12 and sensor resistor 14 shunts the other coil. Resistor 14 typically has a value of 1 to 88 ohms as a function of the fuel level. Ground 15 would be a direct connection to the fuel tank which is a vehicle ground. Ground 16 represents the gauge ground which is typically located upon the vehicle dashboard. The ground offset potential 17 represents the difference in potential that exists between the gas tank and the dashboard. It can be seen that the offset potential is in series with the sense resistor 14 as far as the gauge circuit is concerned.

FIG. 2 is a graph depicting the typical performance of the gauge of FIG. 1 The horizontal scale represents the value of resistor 14 and the vertial scale represents the deflection of the meter which consists essentially of coil 12. Curve 18 is a linear plot extending over the span of the gauge. Curve 19 is an actual plot of the meter deflection as a function of resistance. It can be seen that there is substantial nonlinearity. Curve 20 shows the gauge performance in the presence of a 2−volt offset potential 17. The offset error Is in excess of 10 degrees at the low resistance portion and in excess of 5 degrees at the high resistance end. It can be seen that gauge performance is poor at least due to nonlinearity errors and the presence of an offset potential can. Further increase the error. Such performance has been considered acceptable. For the conventional narrow angle (60 degree) gauges. It is to be understood that in the prior art it was well known that if the gauge circuit of FIG. 1 is provided with a constant current input supply (rather than constant voltage as shown) the linearity will be greatly improved. However, it has been felt that the added cose will not justify the improved linearity. Accordingly, the FIG. 1 circuit has been widely used as shown.

In recent years wide angle air core meters have become available. For example, the Faria Company, of Uncasville, CT., has produced a Model MT203 air core moving magnet indicator. It consists of a pair of 225 ohm air core coils mounted in quadrature relationship. A pointer attached to a moving magnet can be driven over a 305-degree range at typically +2% accuracy. The LM1819 integrated circuit includes a function generator that develops suitable coil currents in response to the output of a Norton amplifier that receives a current input. This IC device is produced by National Semiconductor Corporation to drive the coils in wide-angle meters. This integrated circuit is listed on pages 5-117 to 5-124 of LINEAR DATABOOK 3 ©1987, by National Semiconductor Corporation. The teaching in this publication is incorporated herein by reference. As shown in the databook, one application calls for a current input of 0–100 microamperes which will produce a pair of output currents that, when combined in the air more coils of a wide angle meter, will drive the meter pointer over a 0 to 270 degree deflection. The device can be made voltage responsive by coupling a voltage-to-current converter to the control current input terminal.

The LM1819, when driving a wide angle gauge indicator, provides good linearity, but, in the typical automotive environment, will be subject to offset potentials. It would be desirable to eliminate offset potential response in a wide angle qauqe driver.

SUMMARY OF THE INVENTION

It is an object of the invention to provide a wide angle air more meter drive in a gauge circuit that reduces response to offset potentials.

It is a further object of the invention to drive the sense resistor in a gauge circuit with a constant current supply having an a-c component and coupling the sense voltage to a detector that responds to the a-c component to drive function generator circuits that operate to deflect the pointer in a wide angle air core coil meter.

These and other objects are achieved as follows. An oscillator is coupled to a current source circuit that is connected to a sense resistor which varies in value in response to a physical parameter. This creates a constant value pulsating current in the sense resistor which thereby develops a pulsating voltage proportional to the sense resistor value. The pulsating voltage is capacitively coupled to a detector so that the pulsations will be rectified. The detector d-c output is coupled to buffer and function generator circuits that drive the coils in a wide angle air more meter. Since any offset voltage present in the sense resistor coupling will be d-c, or at least very low in frequency, the offset will not be coupled to the detector. Thus, the a-c component of the pulsating sense resistor current will give an accurate sense voltage and the d-c offset will be ignored.

BRIEF DESCRIPTION OF THE DRAWING

FIG. 1 is a schematic diagram of a prior art gauge circuit employing a arrow angle air core meter movement.

FIG. 2 is a graph showing the electrical performance of the circuit of FIG. 1.

FIG. 3 is a schematic-block diagram of the circuit of the invention.

FIG. 4 is a block diagram of a wide angle air core meter circuit that incorporates the invention.

FIG. 5 is a schematic-block diagram of a circuit that employs the invention.

FIG. 6 is a gauge showing a preferred current waveform useful in practicing the invention.

FIG. 7 is a graph showing the performance of the circuit of FIG. 5.

DESCRIPTION OF THE INVENTION

FIG. 3 is a combined schematic-block diagram showing the essential elements of the invention. Where the various elements are the same as those of FIG. 1, the same designations are employed. A $V_{CC}$ power supply, the vehicle battery, is connected + to terminal 10 and − to ground terminal 11. A constant current device 22 supplies current to sense resistor 14. The gauge, which will include a wide angle air core meter, is operated from detector 24 which is coupled by way of capacitor 23 to the sense resistor. Oscillator 25 is coupled to current source 22 so as to modulate the current supplied to sense resistor 14. Capacitor 33 is selected to pass the signal components at the frequency of oscillator 25. Since the offset voltage 17 is d-c (or of low frequency) the offset will be rejected by capacitor 23. It has been found that the offset voltage 17 in a typical vehicle will have frequency components that peak al about 1 Hz and do not have any substantial components above about 10 Hz. Thus, if oscillator 25 is operated at about 1 kHz or higher and the coupling capacitor 23 selected to pass all frequencies at or above 1 kHz the sense resistor offset voltage will be substantially rejected.

FIG. 4 is a block diagram of a circuit that can be implemented in IC form to make use of the invention. The constant current sense resistor source 22, as described in FIG. 3, is employed to produce good gauge linearity because the use of a wide angle air core meter 26 is contemplated. The function generator circuits 27 and buffer 28 provide suitable currents to the sine and cosine coils in meter 26 so as to deflect the meter pointer as a function of the d-c voltage out of detector 24. These latter elements are as employed in the LM1819 described above.

FIG. 5 is a combined schematic-block diagram of circuits that produce the Functions of current source 22 and detector 24 of FIGS. 3 and 4. Oscillator 25 can be, for example, an LM555 timer IC connected to operate as an oscillator at a predetermined frequency. This IC is available from National Semiconductor Corporation and others. It is detailed, on pages 5–38 through 5–45, in the above-mentioned data book. Resistors 30 and 31 couple a portion of the output of oscillator 25 to switch transistor 32 which has a variable resistor 33 in its emitter. Resistor 33 is adjusted to set the current flowing in transistor 32 when it is switched on. The current in transistor 32 also flows in resistor 34 and diode-connected transistor 35. Transistor 36 is coupled to transistor 35 to form a current mirror, the output of which supplies current to sense resistor 14. In the circuit shown, transistor 36 is made to have ten times the area of transistor 35 so that the current mirror has a current gain of ten. Resistor 33 can be set so that when two milliamperes flow in transistor 35 twenty milliamperes will then flow in sense resistor 14. Due to the action of oscillator 25 this sense current will be pulsating. The pulsating voltage developed across sense resistor 14 is coupled by way of capacitor 23 and resistor 37 to the inverting input of op-amp 38. This amplifier can be a well known LF400 available from National Semiconductor Corporation and others. Op-amp 38 is coupled into the well known charge-step demodulator circuit by means of diodes 39 and 40 along with resistor 41 and capacitor 42. The output at terminal 43 will be a d-o potential proportional to the peak amplitude of the pulsating signal developed across resistor 14. Since capacitor 23 was selected to pass the frequency components of oscillator 25 and to reject the offset voltage 17 the signal at terminal 43 will be determined only by the sense resistor value.

FIG. 6 is a graph showing a waveform that is preferred for the pulsating sense current. The spacing between pulses of 10 mS represents an oscillator frequency of 100 Hz. The pulse width of one mS indicates a 10% duty cycle which provides a substantial power economy for the circuit. The pulse is shown having a 20 ma amplitude and the edge slope is ramped. A ramp of about 0.1 ma/microsecond will result in a signal having very little energy above 10 kHz. Thus, the circuit produces very little electromagnetic interference when this waveform is employed.

EXAMPLE

The circuit of FIG. 5 was constructed using the components described. The following component values were employed:

| COMPONENT | VALUE |
| --- | --- |
| Capacitor 23 | .047 microfarad |
| Resistor 30 | 2 k ohms |
| Resistor 31 | 2 k ohms |
| Resistor 33 | 5 k ohms (variable) |
| Resistor 34 | 200 ohms |
| Resistor 37 | 1 k ohms |
| Resistor 41 | 15 k ohms |
| Capacitor 42 | 1 microfarad |

Oscillator 25 was operated at 2000 Hz. $V_{CC}$ was 13 volts. Resistor 33 was adjusted to produce a 20 ma peak sense resistor current. The circuit performance was taken for sense resistor values of 0 to 600 ohms. A plot of the performance including a −2 volt offset is shown as curve 44 in FIG. 7. Curve 45 represents a +2 volt offset. It can be seen that a deflection of about 170 degrees for the wide angle meter was observed at about 600 ohms. The maximum error is only a few percent. The offset rejection is clearly seen when FIG. 7 is compared with FIG. 2.

The invention has been described and a working example detailed. When a person skilled in the art reads the foregoing description, alternatives and equivalents, within the spirit and indent of the invention, will be apparent. Accordingly, it is intended that the scope of the invention be limited only by the following claims.

I claim:

1. In a locally grounded gauge circuit, having a remotely grounded sense resistor that is supplied with an excitation current whereby said sense resistor develops a sense potential that is a function of a parameter the gauge circuit is intended to monitor, wherein an offset potential exists between said locally grounded gauge circuit and said remotely grounded resistor, said gauge circuit comprising:

means for varying said excitation current at a predetermined frequency;

a detector configured to respond to variations in said sense potential thereby to produce an output proportional to the variations in said excitation current; and capacitor coupling means for passing said sense potential variations to said detector wherein said capacitor has a value selected to couple said variations in said sense potential and to reject said offset potential.

2. The gauge circuit of claim 1 wherein said excitation current is supplied by a modulated constant current source.

3. The gauge circuit of claim 2 wherein said constant current source comprises a current mirror and an oscillator is coupled to the input of said current mirror whereby said excitation current is modulated.

4. The gauge circuit of claim 3 wherein said oscillator is made to have a frequency that is substantially higher than the frequencies associated with said offset potential.

5. The gauge circuit of claim 4 wherein said oscillator is configured to produce a signal composed of pulse a having a low duty cycle.

6. The gauge circuit of claim 5 wherein said pulses are controlled to have sloping edges that result in low harmonic signal content thereby to minimize electromagnetic interference radiation.

* * * * *